US012568783B2

(12) United States Patent
Yang et al.

(10) Patent No.: US 12,568,783 B2
(45) Date of Patent: Mar. 3, 2026

(54) SILVER-BASED TRANSPARENT CONDUCTIVE LAYERS INTERFACED WITH COPPER TRACES AND METHODS FOR FORMING THE STRUCTURES

(71) Applicant: EKC Technology, Inc., Hayward, CA (US)

(72) Inventors: Xiqiang Yang, Hayward, CA (US); Yadong Cao, San Jose, CA (US); Ajay Virkar, San Mateo, CA (US)

(73) Assignee: EKC TECHNOLOGY, INC., Hayward, CA (US)

( * ) Notice: Subject to any disclaimer, the term of this patent is extended or adjusted under 35 U.S.C. 154(b) by 1093 days.

(21) Appl. No.: 17/570,571

(22) Filed: Jan. 7, 2022

(65) Prior Publication Data

US 2022/0132672 A1 Apr. 28, 2022

Related U.S. Application Data

(62) Division of application No. 16/417,692, filed on May 21, 2019, now abandoned.

(Continued)

(51) Int. Cl.
*H01L 21/306* (2006.01)
*C09K 13/04* (2006.01)
(Continued)

(52) U.S. Cl.
CPC ........ *H01L 21/30604* (2013.01); *C09K 13/04* (2013.01); *C09K 13/06* (2013.01);
(Continued)

(58) Field of Classification Search
None
See application file for complete search history.

(56) References Cited

U.S. PATENT DOCUMENTS 8,049,333 B2   11/2011   Alden et al.
8,426,741 B2   4/2013   Yamazaki
(Continued)

FOREIGN PATENT DOCUMENTS

CN   104678700   *   6/2015   ............... C08F 2/44
CN   110333793   *   10/2019   ............. G06F 3/041
(Continued)

OTHER PUBLICATIONS

T. Sannicolo et al., "Metallic nano-wire-based transparent electrodes for next generation flexible devices: a review", Small, vol. 12, pp. 6052-6075. (Year: 2016).*

*Primary Examiner* — Jiong-Ping Lu
(74) *Attorney, Agent, or Firm* — Christensen, Fonder, Dardi PLLC; Peter S. Dardi; Elizabeth A. Gallo

(57) ABSTRACT

A method is described for method for patterning a metal layer interfaced with a transparent conductive film, in which the method comprises contacting a structure through a patterned mask with an etching solution comprising $Fe^{+3}$ ions, wherein the structure comprises the metal layer comprising copper, nickel, aluminum or alloys thereof covering at least partially a transparent conductive film with conductive elements comprising silver, to expose a portion of the transparent conductive film. Etching solutions and the etched structures are also described.

20 Claims, 3 Drawing Sheets

Related U.S. Application Data

(60) Provisional application No. 62/674,842, filed on May 22, 2018, provisional application No. 62/751,788, filed on Oct. 29, 2018.

(51) Int. Cl.

| | |
|---|---|
| *C09K 13/06* | (2006.01) |
| *G06F 3/041* | (2006.01) |
| *G06F 3/044* | (2006.01) |
| *H01L 21/302* | (2006.01) |
| *H01L 21/304* | (2006.01) |
| *H01L 21/308* | (2006.01) |
| *H01L 21/311* | (2006.01) |
| *H05K 1/02* | (2006.01) |
| *H05K 3/06* | (2006.01) |

(52) U.S. Cl.

CPC .......... *G06F 3/04164* (2019.05); *G06F 3/044* (2013.01); *H01L 21/302* (2013.01); *H01L 21/3043* (2013.01); *H01L 21/306* (2013.01); *H01L 21/308* (2013.01); *H01L 21/3081* (2013.01); *H01L 21/311* (2013.01); *H01L 21/31144* (2013.01); *H05K 1/0296* (2013.01); *H05K 3/061* (2013.01); *H05K 3/062* (2013.01); *H05K 3/067* (2013.01); *G06F 3/041* (2013.01); *G06F 2203/04103* (2013.01); *G06F 2203/04112* (2013.01); *H05K 1/0274* (2013.01); *H05K 2201/0108* (2013.01); *H05K 2201/026* (2013.01); *H05K 2201/09681* (2013.01); *H05K 2203/0548* (2013.01); *H05K 2203/0789* (2013.01)

(56) References Cited

U.S. PATENT DOCUMENTS

| | | | |
|---|---|---|---|
| 8,748,749 | B2 | 6/2014 | Srinivas et al. |
| 9,052,587 | B2 | 6/2015 | Yamazaki et al. |
| 9,150,746 | B1 | 10/2015 | Li et al. |
| 9,183,968 | B1 | 11/2015 | Li et al. |
| 9,217,889 | B2 | 12/2015 | Li |
| 9,373,299 | B2 | 6/2016 | Hasumi et al. |
| 9,381,534 | B2 | 7/2016 | Kim et al. |
| 9,530,534 | B2 | 12/2016 | Hu et al. |
| 9,847,150 | B2 | 12/2017 | Naito et al. |
| 9,874,982 | B2 | 1/2018 | Bae et al. |
| 9,920,207 | B2 | 3/2018 | Virkar et al. |
| 10,020,807 | B2 | 7/2018 | Virkar et al. |
| 10,029,916 | B2 | 7/2018 | Virkar et al. |
| 2004/0072444 | A1* | 4/2004 | Park .......................... C23F 1/30 257/E27.113 |
| 2011/0165514 | A1 | 7/2011 | Yamazaki |
| 2012/0146921 | A1 | 6/2012 | Park |
| 2012/0227259 | A1 | 9/2012 | Badaye et al. |
| 2013/0000959 | A1 | 1/2013 | Park et al. |
| 2014/0021400 | A1 | 1/2014 | Coenjarts |
| 2014/0152935 | A1 | 6/2014 | Heo et al. |
| 2014/0205863 | A1 | 7/2014 | Byun et al. |
| 2014/0238833 | A1 | 8/2014 | Virkar et al. |
| 2014/0342129 | A1 | 11/2014 | Kim et al. |
| 2015/0144380 | A1 | 5/2015 | Yang et al. |
| 2016/0147346 | A1 | 5/2016 | Lee et al. |
| 2016/0195966 | A1 | 7/2016 | Chang et al. |
| 2016/0293288 | A1 | 10/2016 | Hu et al. |
| 2017/0102818 | A1 | 4/2017 | Ahn et al. |
| 2018/0101269 | A1 | 4/2018 | Le et al. |
| 2019/0064968 | A1 | 2/2019 | Liu et al. |

FOREIGN PATENT DOCUMENTS

| | | | | |
|---|---|---|---|---|
| JP | 2001181868 | * | 7/2001 | ............... C23F 1/18 |
| JP | 2010-249926 A | | 11/2010 | |

* cited by examiner

SILVER-BASED TRANSPARENT CONDUCTIVE LAYERS INTERFACED WITH COPPER TRACES AND METHODS FOR FORMING THE STRUCTURES

CROSS REFERENCE TO RELATED APPLICATIONS

This is a divisional of U.S. patent application Ser. No. 16/417,692 filed on May 21, 2019 to Yang et al., entitled "Silver Based Transparent Conductive Layers Interfaced with Copper Traces, Methods for Forming the Structures, and Corresponding Touch Sensors," which claims priority to U.S. provisional patent application 62/674,842 filed on May 22, 2018 to Yang et al., entitled "Silver Based Transparent Conductive Layers Interfaced with Copper Traces, Methods for Forming the Structures, and Corresponding Touch Sensors," and to U.S. provisional patent application 62/751,788 filed Oct. 29, 2018 to Yang et al. entitled "Silver Based Transparent Conductive Layers Interfaced with Copper Traces, Methods for Forming the Structures, and Corresponding Touch Sensors," both of which are incorporated herein by reference.

BACKGROUND OF THE INVENTION

Touch sensors are important components for a wide range of electronic devices. For example, a wide range of smart hand held consumer electronics such as smart phones, tablets, laptop computers, and various other digital assistants rely on touch screens. Also, computer screens, large area displays, and the like are increasingly incorporating touch sensor technologies. Consumer interest drives the touch sensor designs into increasingly demanding formats that correspondingly involve more challenging processing techniques.

SUMMARY OF THE INVENTION

In a first aspect, the invention pertains to a method for patterning a metal layer interfaced with a transparent conductive film, the method comprising the step of contacting a structure through a patterned mask with an etching solution comprising $Fe^{+3}$ ions, wherein the structure comprises the metal layer comprising copper, nickel, aluminum or alloys thereof covering at least partially a transparent conductive film with conductive elements comprising silver, to expose a portion of the transparent conductive film.

In a further aspect, the invention pertains to a patterned film comprising a polymer substrate, a transparent conductive film covering at least part of a surface of the polymer substrate and metal traces confined to at least a portion of a bezel region along a border of the surface, wherein elements of the transparent conductive film are in electrical contact with a portion of the metal trace to form a conduction pathway through the transparent conductive film, wherein the transparent conductive film has a sheet resistance of no more than 95 ohms/sq, and wherein the metal traces have a configuration of an etched material.

In another aspect, the invention pertains to an etching solution consisting essentially of water, from about 0.001M to about 0.25M $Fe^{+3}$, strong acid at a concentration rom about 0.0001M to about 0.1M, optionally from 0.001 wt % to about 0.5 wt % surfactant, and optionally from 0 to about 0.25M $Fe^{+2}$, along with selected anions for charge balance of the listed cations.

DETAILED DESCRIPTION OF THE INVENTION

Appropriate techniques for the etching of copper films without damaging a silver based transparent conductive layer provides for effective processing to form electrically conductive traces connected to the transparent conductive electrodes of a touch sensor. The formation of conductive traces over a smaller fraction of a surface can involve etching of a conductive film driven by photolithography as an alternative to printing of conductive paste that can be difficult for intricate compact structures. Etching as described herein can be provided by iron+3 ion that is found to effectively oxidize copper, and nickel, without significantly damaging a sparse silver conductive layer. The processing described herein can be effective for the formation of transparent touch sensors with an area of transparent conductive film with a small border (narrow bezel) of conductive traces that connect the touch sensor to control electronics. The patterning to provide the etching can be based on lithography with a radiation sensitive resist.

Figure 1:
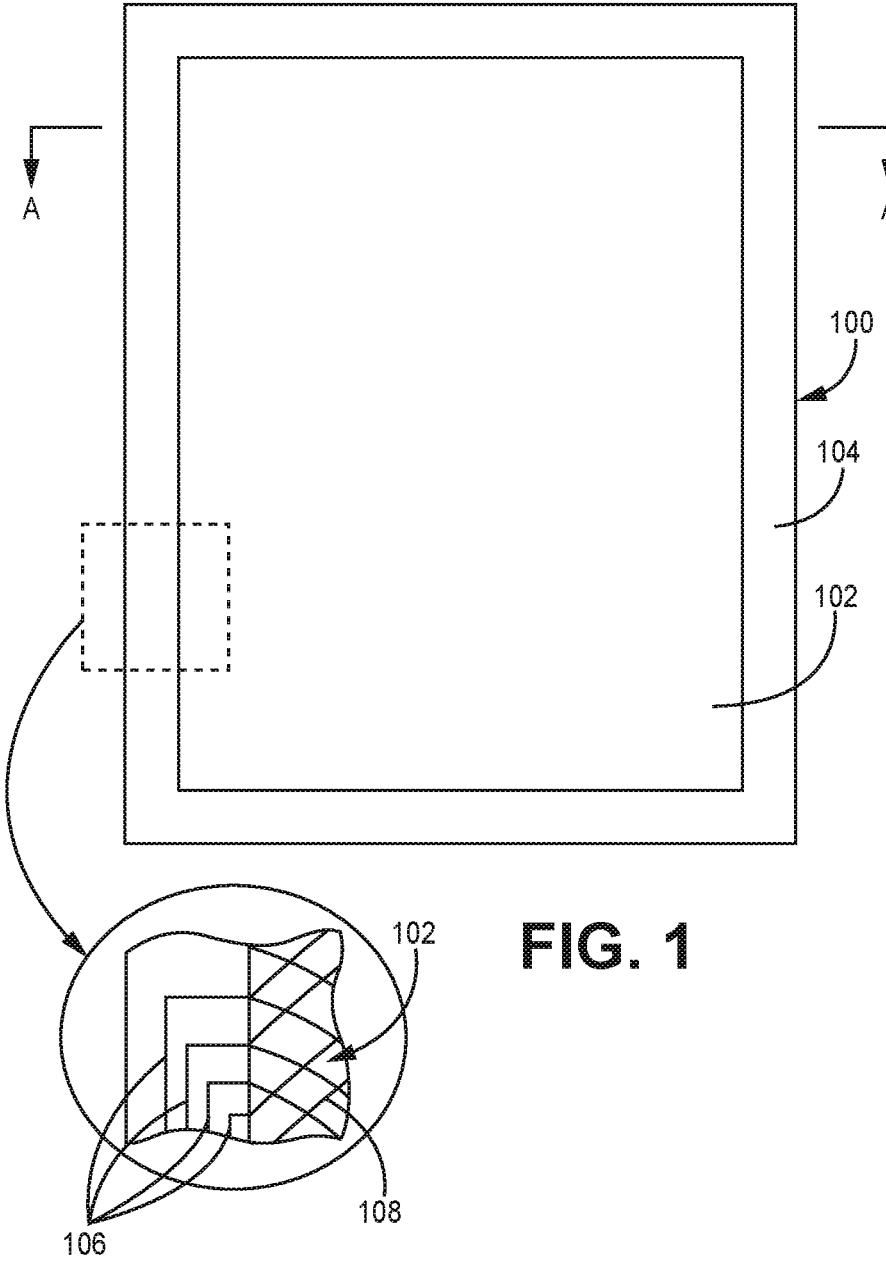
FIG. 1 is top view of a display device with a touch sensor with an expanded section showing structure at an interface between a transparent conductive film and copper traces at a bezel region along the boundary of the device.

A top view of an electronic device with a touch sensor is shown in FIG. 1. Device 100 comprises a transparent touch sensor 102 with a boundary zone or bezel 104. Conductive traces providing connection of the touch sensor with processing electronics are placed in the area of bezel 104 since they are not transparent. Referring to the insert of FIG. 1, metal traces 106 connected to patterned elements 108 of a transparent conductive film of transparent touch sensor 102. To increase the relative area of the touch sensor and display through the touch sensor, the bezel areas are made smaller. Metal traces within the bezel area forming the electrical connections between the touch sensor and processing electronics have traditionally been formed using conductive paste, such as silver paste, that is printed in the form desired for the metal traces. With shrinking dimensions, the printing of a conductive paste to form the metal traces becomes difficult or impractical. The processing approaches described herein provide a practical alternative to the printing approach for the formation of the conductive metal traces.

Figure 2:
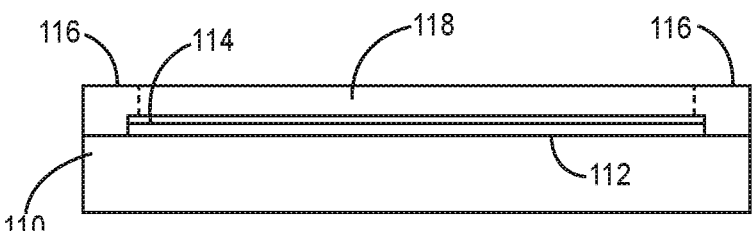
FIG. 2 is cross sectional view of the device of FIG. 1 taken along line A-A prior to etching a copper layer.

To provide the metal for the metal traces, a film of metal can be deposited over the surface of the structure using a suitable deposition approach, such as a physical vapor depositions (e.g., sputtering or evaporation). A schematic view of a cross section along line A-A of FIG. 1 is shown in FIG. 2. Substrate 110 supports sparse silver conductive layer 112, which is covered with polymer overcoat 114. Sparse silver conductive layer 112 and polymer over coat 114 are excluded from all or a significant fraction of bezel region 116 prior to deposition of metal film 118, and sparse silver conductive layer 112 can be patterned across the area of touch sensor 102 (FIG. 1) prior to depositing metal film 118, although alternatively or additionally patterning of the transparent conductive film can be performed after etching the copper layer. Metal film 118 then needs to be removed to expose transparent touch sensor 102 as well as to pattern conductive metal traces 106 in bezel region 116 that are designed to conduct current appropriately for connection to the processing electronics.

Lithography with a suitable resist can form a pattern for etching the metal film. While electron beam lithography can be used, photolithography using UV light and corresponding photoresists would be appropriate and generally available at a reasonable cost. Both positive photoresists and negative photoresists for UV lithography are commercially available, such as DNQ-novolac resins for positive photoresists and SU-8 epoxy-based negative photoresists, or dry film resists from suppliers such as DuPont or Asahi Kasei. A physical pattern formed with the resists can guide wet etching to selectively remove metal/copper at exposed regions through the developed resist. Following etching, the remaining resist can be stripped from the structure.

Figure 3:
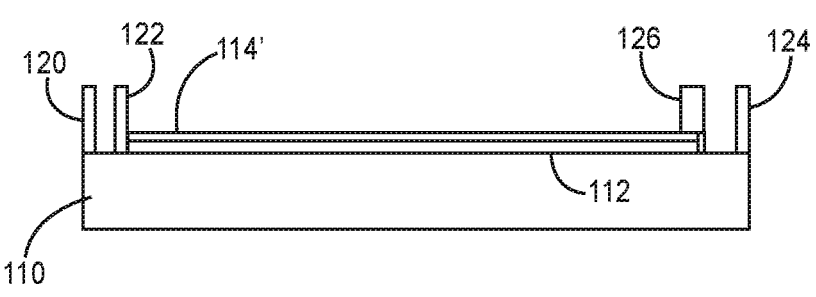
FIG. 3 is a cross sectional view as shown in FIG. 2 after an etching step to remove a copper layer over most of the transparent conductive film and to pattern the copper layer into traces along the bezel region with appropriate points of contact between the copper traces and the transparent conductive film.

A representative schematic cross section of the structure taken along line A-A of FIG. 1, following etching, is shown in FIG. 3. Referring to FIG. 3, substrate 110 and sparse silver conductive layer 112 can be substantially unchanged following the etching of the metal/copper. Polymer overcoat 114 may or may not be unchanged relative to initial polymer overcoat 114. In the schematic drawing of FIG. 3, the metal/copper film is etched to form metal traces 120, 122, 124, 126. Metal trace 126 is in contact with sparse metal conductive layer 112. In some embodiments, the structures formed from the etching process can have a resolution of no more than about 5 microns, and in further embodiments no more than about 2.5 microns. New designs are shrinking the bezel regions to increase display sizes for a physical device dimension with bezel dimensions being contemplated less than 5 millimeters in width along the edge of the device. A person of ordinary skill in the art with recognize that additional ranges of resolution and dimensions within the explicit ranges above are contemplated and are within the present disclosure.

Commercial transparent conductive films have been primarily based on conductive metal oxides, such as indium tin oxide (ITO), aluminum zinc oxide, or other conductive doped metal oxides. There is a growing commercial use of silver nanowire-based transparent conductive films for touch sensors and other applications, which can provide desirable properties. The silver nanowire-based structures can be referred to as sparse metal conductive layers, which describes the microscopic nature of their structure. Transparent conductive films based on sparse metal conductive layers have significantly different etching properties relative to the conductive metal oxides. A thin polymer overcoat may be placed over the sparse metal conductive layer, which may provide some resistance to etching but generally not sufficient protection under conditions appropriate to etch copper. Etching techniques described herein overcome these complications to provide for selective etching of a metal/copper film while not significantly damaging a silver-based sparse metal conductive layer.

The conductive layers are generally sparse to provide desired amount of optical transparency, so the coverage of the metal has very significant gaps over and between the layer of the conductive element. For example, transparent electrically conductive films can comprise metal nanowires deposited along a layer where sufficient contact can be provided for electron percolation to provide suitable conduction pathways. In other embodiments, the transparent electrically conductive film can comprise a fused metal nanostructured network, which has been found to exhibit desirable electrical and optical properties.

In general, various sparse metal conductive layers can be formed from metal nanowires. Films formed with metal nanowires that are processed to flatten the nanowires at junctions to improve conductivity is described in U.S. Pat. No. 8,049,333 to Alden et al., entitled "Transparent Conductors Comprising Metal Nanowires," incorporated herein by references. Structures comprising surface embedded metal nanowires to increase metal conductivity are described in U.S. Pat. No. 8,748,749 to Srinivas et al., entitled "Patterned Transparent Conductors and Related Manufacturing Methods," incorporated herein by reference. However, improved properties have been found for fused metal nanostructured networks with respect to high electrical conductivity and desirable optical properties with respect to transparency and low haze. Fusing of adjacent metal nanowires can be performed based on chemical processes under commercially appropriate processing conditions.

In particular, a significant advance with respect to achieving electrically conductive films based on metal nanowires has been the discovery of well controllable processes to form a fused metal network where adjacent sections of the metal nanowires fuse. In particular, it was discovered that halide ions can drive the fusing of metal nanowires to form fused metal nanostructures. Fusing agents comprising halide anions were introduced in various ways to successfully achieve the fusing with a corresponding significant drop in the electrical resistance. Specifically, the fusing of metal nanowires with halide anions has been accomplished with vapors and/or solutions of acid halides as well as with solutions of halide salts. Fusing of metal nanowires with halide sources is described further in U.S. Pat. No. 10,029, 916 to Virkar et al., entitled "Metal Nanowire Networks and Transparent Conductive Material," and 9,920,207 to Virkar et al., entitled "Metal Nanostructured Networks and Transparent Conductive Material," both of which are incorporated herein by reference.

An extension of the process for forming fused metal nanowire networks was based on reduction/oxidation (redox) reactions that can be provided to result in fused nanowires without destroying the optical properties of the resulting film. Metal for deposition at the junctions can be effectively added as a dissolved metal salt or can be dissolved from the metal nanowires themselves. The effective use of redox chemistry for fusing metal nanowires into a nanostructured network is described further in U.S. Pat. No. 10,020,807 to Virkar et al. (the '807 patent), entitled "Fused Metal Nanostructured Networks, Fusing Solutions with Reducing Agents and Methods for Forming Metal Networks," incorporated herein by reference. The '807 application also described a single solution approach for the formation of fused metal nanostructured networks. Single solution approaches for the formation of fused metal nanostructured layers are described further in U.S. Pat. No. 9,183,968 B1 to Li et al, entitled "Metal Nanowire Inks for the Formation of Transparent Conductive Films with Fused Networks," incorporated herein by reference, and single solution or ink processing to form fused metal nanostructured networks is used in the Examples below.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results with one ink systems, hydrophilic polymers have been found to be effective, such as cellulose or chitosan based polymers. Metal ions, as a source of metal for the fusing process, can be supplied as a soluble metal salt.

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, or other organic compositions, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties on a substrate surface. As described further below, drying conditions can be selected to effectively perform the fusing process. Two solution fusing systems have also been established and can take advantage of the improved silver nanowires described herein.

As noted above, for handling of the transparent conductive films, a protective polymer overcoat generally can be placed over the sparse silver conductive layer. Also, with respect to processing, the polymer overcoats can be applied using solution coating techniques, or other processing approaches such as extrusion, lamination, calendering, melt coating techniques or the like. If there is a plurality of polymer overcoats, they may or may not be applied using similar approaches. For solution processed overcoats, the various coating approaches such as slot coating, spray coating, and the like can be applied to these layers as well as the silver nanowire ink layers. In general, the polymer overcoats can have average thicknesses from about 10 nanometers (nm) to about 12 microns, in further embodiments, from about 15 nm to about 10 microns, in additional embodiments from about 20 nm to about 8 microns and in some embodiments from about 25 nm to about 500 nm. In some embodiments, it may be possible to select an overcoat by choice of the refractive index and thickness such that after application of the overcoat the haze is significantly reduced without significantly degrading other properties. Also, the thickness and compositions of the overcoat can be selected such that the resistance measurement through the overcoat is not significantly altered relative to the measurement without the overcoat. A person of ordinary skill in the art will recognize that additional ranges of overcoat thicknesses within the explicit ranges above are contemplated and are within the present disclosure. Suitable commercial coating compositions for overcoats include, for example, coating solutions from POSS® Coatings from Hybrid Plastics, Inc. (Mississippi, USA), Dexerials Corporation (Japan), Opstar from JSR Corporation (Japan), acrylic hard-coats from JNC-Chisso (Japan), Nidek (Japan), silica filled siloxane coatings from California Hardcoating Company (California, USA), CrystalCoat UV-curable coatings from SDC Technologies, Inc. (California, USA).

For the formation of the metal traces, a transparent substrate, such as a polymer substrate, is coated with an ink for forming the sparse metal/silver conductive layer upon and optionally a thin polymer overcoat can be applied over the sparse metal conductive layer. The polymer overcoat can be crosslinked, for example, with UV light. The sparse metal conductive layer generally is patterned to form structures suitable for the operation of the touch sensor or other electronic component incorporating the structure. The patterning of the sparse metal conductive layer may or may not be performed prior to the patterning of the metal traces. If the bezel area is appropriately free of the sparse metal conductive layer prior to the deposition of the metal film, then that portion does not need etching of the sparse metal conductive layer following patterning of the metal traces. Based on the ability to etch the sparse metal conductive layer without damaging metal traces, as described below, portions of the sparse metal conductive layer between metal traces can be etched after forming the metal traces to avoid short circuits between portions of the metal traces.

Along the boundary of the bezel area with the transparent sparse metal/silver conductive layer, there may be regions of effective overlap of a metal trace and the sparse metal/silver conductive layer. The metal film generally comprises copper, and it has been observed that suppliers forming the copper films, generally by sputtering, may apply a thin nickel layer over the copper, possibly to protect the copper from oxidation or other modification. In some embodiments, the copper film can have an average thickness from about 30 nm to 1 micron, in further embodiments from about 50 nm to about 800 nm and in additional embodiments from about 80 nm to about 600 nm. A fraction of this thickness can be replaced with a protective metal overcoat with a second metal or alloy thereof, such as nickel or aluminum. A person of ordinary skill in the art will recognize that additional ranges of thicknesses within the explicit ranges above are contemplated and are within the present disclosure.

When a transparent conductive film is a metal oxide, such as ITO, an oxidizing acid, such as chromic acid, sulfuric acid or mixtures thereof, can be used to etch the metal (copper) film without damaging the ITO. Assuming this acid removes the polymer overcoat, a strongly oxidizing acid may also etch a sparse silver conductive layer. As described herein, it has been discovered that etching can be performed with iron+3 ($Fe^{+3}$) ions to selectively remove the copper along with nickel or other suitable protective metal without significant damage to a sparse silver conductive layer. To provide additional control of the reduction/oxidation potentials in the etching reaction, the etching solution can further comprise iron+2. The processing can be performed at room temperature, although the temperature can be varied to adjust processing issues, such as the etching time. In general, nickel or other protective metal coating can be etched away quickly, with the etching of the copper generally taking more time. The uniformity of the etching process can be significantly improved through the addition of a surfactant to the etching solution.

The etching solution generally comprises an aqueous solution with a source of iron+3, an optional acid, an optional surfactant, and an optional source of iron+2. Specifically, the etching solution can comprise from about 0.001M to about 0.25M $Fe^{+3}$, in further embodiments from about 0.002M to about 0.2M, and in additional embodiments from about 0.0025M to about 0.15M $Fe^{+3}$. The etching solution can optionally comprise from about 0.001M to about 0.25M $Fe^{+2}$, in further embodiments from about 0.002M to about 0.2M, and in additional embodiments from about 0.0025M to about 0.15M $Fe^{+2}$. A person of ordinary skill in the art will recognize that additional concentration ranges within the explicit ranges above are contemplated and are within the present disclosure. The iron+3 and optionally iron+2 can be supplied as various salts. Suitable sources of iron+3 include, for example, ferric nitrate (iron (III) nitrate, $Fe(NO_3)_3$), ferric sulfate (iron(III) sulfate, $Fe_2(SO_4)_3$), ferric chloride (iron(III) chloride, $FeCl_3$), ferric fluoride (iron(III) fluoride, $FeF_3$), mixtures thereof, or the like. Sources of iron+2 include, for example, ferrous sulfate ($FeSO_4$), ferrous chloride ($FeCl_2$), or the like.

The optional acid can be added in a concentration below a concentration that would be expected to effectively etch the copper itself. While not wanting to be limited by theory, it is believed that the acid in the relevant concentration ranges helps to catalyze the iron reaction possibly by limiting the complexation in solution with the iron+3 ions. As shown in the Examples, the reaction rate is essentially independent of the acid concentration. Convenient acids include, for example, nitric acid ($HNO_3$), sulfuric acid ($H_2SO_4$), phosphoric acid ($H_3PO_4$), hydrochloric acid HCl, mixtures thereof, and the like. It is expected that weak acids can be used to provide a comparable pH. Generally, it is desirable to select a Bronsted-Lowry acid with an anion that does not complex strongly with iron+3. With a strong acid, such as nitric acid, the etching solution can comprise from about 0.0001M to about 0.1M, in further embodiments from about 0.0002M to about 0.05M, and in additional embodiments from about 0.00025M to about 0.03M. A person of ordinary skill in the art will recognize that additional ranges of acid concentrations within the explicit ranges above are contemplated and are within the present disclosure.

An optional surfactant or wetting agent is found to improve the uniformity of the etching process, although the surfactant is observed to slow the etching rate. As found in the Examples, there are balancing effects in the selection of the amount of surfactant. While not wanting to be limited by theory, it is believed that the surfactant facilitates wetting of the surfactant to be etched by the etching solution. The Examples are directed to TRITON™ X-100 (Dow Chemical) a commonly used non-ionic surfactant. Other potential surfactants such as Brij™ (ThermoFisher Scientific), tween 20, sodium dodecyl sulfate (SDS), and short chain alcohols such as ethanol, propanols, and butanols, which are effective to lower the surface tension of water. It is believed that a wide range of surfactants can be effective, including non-ionic, anionic, cationic, and amphoteric (zwitterionic) surfactants. Generally, it is desirable to select a surfactant that does not form significant ligand-metal bonds as $Fe^{+3}$-complexes that may reduce the effectiveness of the iron+3 etching. A range of commercial non-ionic surfactants are available from BASF in the Pluronic™ series. Other commercial surfactants useful in the present invention are Tergitols® from Dow Chemical, Dynol™ superwetting surfactants and Surfynol® surfactants from Evonik Industries AG, Lutensols® from BASF, fluorosurfactants from 3M (Novec™ Fluorosurfactants) and Chemours (Capstone™ Fluorosurfactants). If desired, the surfactant/detergent can be selected to have a relatively small effect on the pH of the solution. The etching solution can comprise from about 0.001 weight percent (wt %) to about 0.5 wt % surfactant, in further embodiments from about 0.002 wt % to about 0.4 wt %, and in additional embodiments from about 0.0025 wt % to about 0.3 wt % surfactant. A person of ordinary skill in the art will recognize that additional ranges of surfactant concentrations within the explicit ranges above are contemplated and are within the present disclosure.

In some embodiments, the etching solution consist essentially of water, from about 0.001M to about 0.25M $Fe^{+3}$, strong acid at a concentration rom about 0.0001M to about 0.1M, optionally from 0 to about 0.5 wt % surfactant, and optionally from 0 to about 0.25M $Fe^{+2}$, along with inert anions for charge balance of the listed cations. With respect to these specific etching solutions, any of the concentration ranges and implied subranges for the ingredients and listed species of ingredients in the previous three paragraphs apply equally in this paragraph. In a particular embodiment, the anions are nitrate anions and the etching solution comprises at least about 0.001 wt % non-ionic surfactant.

To form the etching solution, deionized water or other purified water generally is used, and the other components are mixed in solution to form the etching solution. Other additives or compatible solvents can be included to facilitate the processing if desired as long as they do not interfere with the etching process, and any amounts of such additional components can be appropriately selected.

In the production stream for the manufacture of a transparent touch sensor or the like and the ultimate electronic device, different processing entities may or may not contribute to appropriate steps. Thus, a polymer substrate can be coated with a silver nanowire ink and appropriately dried to form a transparent conductive film, such as a fused metal nanostructured network. The sparse metal conductive layer can be coated with a polymer overcoat. Before or after deposition of a polymer overcoat, the transparent conductive film can be patterned with structures suitable for a touch sensor or corresponding component. The patterning of the transparent conductive layer may or may not be performed prior to deposition of a copper film, but generally at least a majority of the bezel region is cleared of transparent conductive film possibly excluding some overlap for connection of the metal traces.

For the processing to form the structure, the metal film can be deposited using a suitable deposition approach, such as sputtering or electroplating. The metal film for trace formation generally has a layer of copper and may have a protective metal coating, such as nickel. Sputtering and similar approaches can be used to deposit relatively uniform metal coatings. Once the metal film is formed, the structure is ready for patterning of the metal film using the techniques described herein.

Photolithography equipment is readily available for the desired patterning. A photoresist composition can be coated over the metal film. The photoresist can then be exposed to UV or other appropriate radiation to form a latent image in the photoresist. The structure with the latent image is treated with a developer, such as tetramethylammonium hydroxide for DNQ-novolac photoresists. After development, the developed image forms a physical pattern with exposed regions to be etched. The patterned structure can be contacted with the etching solution to remove the metal film at the exposed regions. The etching solution can be contacted by any suitable approach, such as dipping, spraying, painting, or other suitable delivery approach. The etching solution can be contacted with the patterned structure for an appropriate period of time to remove the metal film at the exposed regions. In particular, the etching solution is generally contacted with the structure for at least about 5 seconds (s), in further embodiments from about 20 s to about 4000 s, and in additional embodiments from about 30 s to about 2500 s. Following the allotted etching time, the structure can be rinsed one or more times with water, such as deionized water, to terminate the reaction and remove any by-products of the etching. A person of ordinary skill in the art will recognize that additional ranges within the explicit ranges of etching time above are contemplated and are within the present disclosure. During etching, the etching process generally is isotropic until the material being etched is removed so that some etching occurs under the edge of the mask to form a non vertical edge and possibly some bowing, although this nonvertical nature of the edge is usually completely inconsequential for subsequent use. Thus, an etched edge generally has a slightly distinct shape from a printed structure or a focused energy, such as a laser etched structure, so that an etched structure generally can be identified with microscopic examination.

After patterning of the metal/copper film using the etching process, the remaining photoresist can be stripped from the structure using a suitable stripping agent, such as NMP (N-methyl pyrrolidone) solvent. The etching of the metal/copper film exposes the transparent conductive film over the touch sensor region, which can then be patterned if this was not performed earlier in the process. In general, the patterning of the sparse silver conductive layer can be performed using photolithography with a suitable etchant solution, using radiation patterning, such as laser ablation, or other suitable approach. Once the transparent sparse silver conductive layer and the metal/copper film are both patterned, the structure can be introduced into additional process steps to produce the touch sensor or the other desired component.

As noted above, the patterning of the sparse metal conductive layer may generally be patterned before or after patterning the metal traces. Using a technique based on a photosensitive coating material that is transparent to visible light, a particularly convenient approach can be used to pattern the sparse metal conductive layer after the copper traces are etched. The patterning technique using a photosensitive coating material below the sparse metal conductive layer is described in U.S. Pat. No. 9,052,587 to Yamazaki et al. (hereinafter the '587 patent), entitled "Conductive Pattern Formation Method, Conductive Pattern-Bearing Substrate, and Touch Panel Sensor," and U.S. Pat. No. 8,426,741 to Yamazaki, entitled "Photosensitive Conductive Film, Method for Forming Conductive Film, Method for Forming Conductive Pattern, and Conductive Film Substrate," both of which are incorporated herein by reference. This proprietary method of Hitachi Chemical Company has been referred to as TCTF (transparent conductive transfer films), and this terminology is maintained herein.

Based on the TCTF technology, the patterning of the sparse metal conductive layer does not need to rely on a further photoresist overcoat. The etching of the sparse metal conductive layer along with at least a portion of the radiation sensitive resin can be performed with a basic pH solution. A simple basic pH solution does not significantly etch the copper traces, so that effective use of TCTF can provide for effective patterning of the transparent conductive film following etching of copper metal traces. The photosensitive resin layer generally comprises a polymer binder, such as acrylic resin, epoxy resin or mixtures thereof, a photopolymerizable compound with ethylenically unsaturated bonds, such as a urethane monomer, and a photopolymerization initiator, such as a radical polymerization initiator, e.g., aromatic ketones.

The photosensitive resin can be exposed to patterned light such that the exposed portions are more resistive to etching. In the '587 patent, a two-step exposure process is used that provides for selective etching of the sparse metal conductive layer and only a surface portion of the photosensitive resin layer. An alkaline solution used to etch the exposed TCTF structure can have a pH from about 9 to 11 and can comprise an aqueous solution of 0.1 to 5 weight percent sodium carbonate possibly with a small amount of optional additives, such as a surfactant, an organic solvent and/or an antifoaming agent. The alkaline solution should not significantly alter the copper traces. Thus, the TCTF structure including the sparse metal conductive layer can be patterned without altering the existing pattern of the copper traces.

Figure 4:
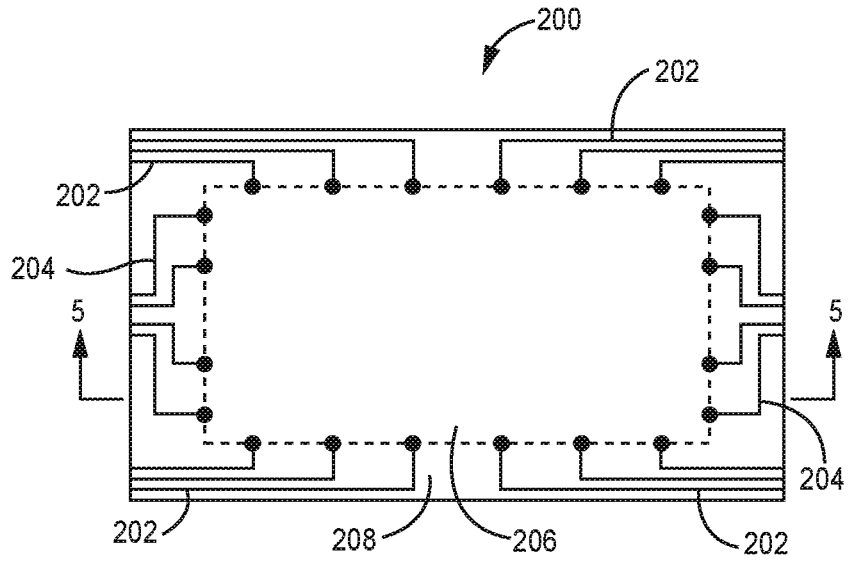
FIG. 4 is a top view of a structure being formed into a display with a transparent touch sensor in which copper traces have been patterned and a TCTF layer has been provided for further patterning.
Figure 5:
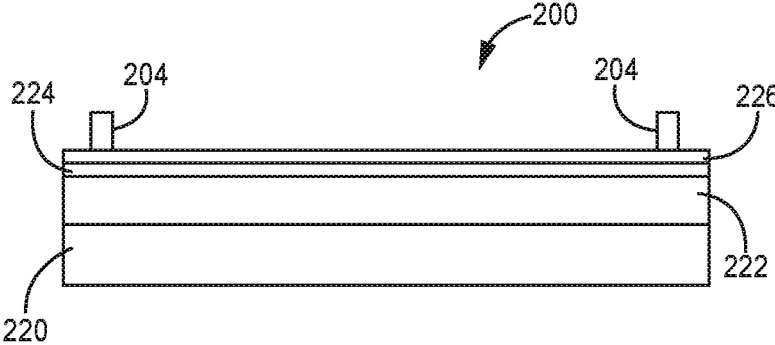
FIG. 5 is a sectional view of the structure of FIG. 4 taken along line 5-5 of FIG. 4.

The process for patterning with TCTF is outlined in FIGS. 4-7 with the bezel region shown in exaggerated proportional size for convenience of depicting the structure. Referring to FIG. 4 with a structure shown prior to etching the TCTF, sensor component structure 200 comprises copper traces 202, 204 on a conductive transparent layer 206 with bezel region 208 marked with dashed lines. A sectional view of sensor component structure 200 is shown in FIG. 5 taken along line 5-5 of FIG. 4. Referring to FIG. 5, a polymer substrate supports the structure. Photosensitive resin layer 222 is located along a surface of substrate 220. Sparse metal conductive layer 224 is on a surface of photosensitive resin layer 222, and an optional overcoat 226 covers sparse metal conductive layer. Patterned copper traces 204 extend upward from overcoat 226 at the locations of the traces in the cross section.

Figure 6:
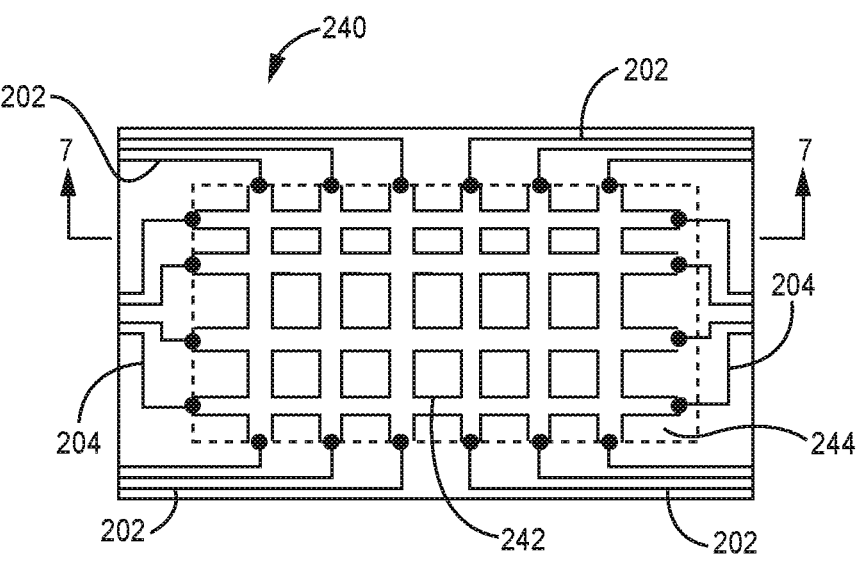
FIG. 6 is a top view of the structure of FIG. 4 following patterning of the transparent conductive film.
Figure 7:
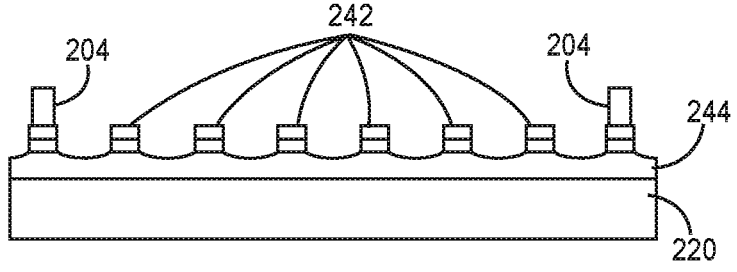
FIG. 7 is a sectional view of the patterned structure of FIG. 6 taken along line 7-7.

The structure in FIG. 4 is irradiated with patterned light along with at least a portion of the photosensitive resin layer. This irradiation to form a latent image provides the pattern for the subsequent etching using a basic etching solution to remove the corresponding portions of the sparse metal conductive layer as well as all or a portion of the radiation sensitive resin in those regions. This etch generally removes the sparse metal conductive layer in the bezel region except for regions of overlap to make connection with the copper traces as well as optionally other regions sufficiently disconnected from the copper traces to avoid short circuit. The transparent region interior to the bezel region is patterned to form functional elements from the sparse metal conductive region, such as transparent electrodes of a touch sensor. The patterned structure is shown in FIGS. 6 and 7. Referring to FIG. 6, patterned sensor component 240 has the copper traces 202, 204 of sensor component structure 200. Sparse metal conductive layer 224 is patterned to form a grid structure 242. The patterned photosensitive layer 244 remains if only a portion of the photosensitive resin is removed in the patterning process. A cross sectional view taken along line 7-7 of FIG. 6 is shown in FIG. 7.

For commercial processing, roll-to-roll processing can be convenient. The above processing procedures can be straightforwardly adapted for roll-to-roll (processing) or roll-to-sheet processing, where product sheets are cut from a continuously processed web. The coating processes can involve suitable deposition techniques, such as spray coating, slot coating, extrusion, lamination or the like, and driers can prepare deposited layers for subsequent processing. The etching can be performed with dip coating or spray coating or the like in a roll-to-roll format, and any rinsing can be similarly performed. In general, additional layers are added to the structure, such as optically clear adhesives and/or laminated protective polymer films.

The processed structures generally have substantially all of the copper removed from locations along the structure selected for etching. Any significant amounts of metal remaining can result in a short circuit of the ultimate touch sensor circuit or equivalent element. At the same time, it is desirable to avoid significant damage to the sparse silver conductive layer. The properties of the transparent conductive film with the sparse metal conductive layer can be evaluated using the sheet resistance. In some embodiments, the sheet resistance can increase by no more than a factor of 50%, in further embodiments no more than 40% and in additional embodiments no more than about 30%. In some embodiments, the sheet resistance can be effectively unchanged, which is currently referenced relative to a variation of roughly 10% based on reproducibility and measurement error. A person of ordinary skill in the art will recognize that additional ranges of sheet resistance changes within the explicit ranges above are contemplated and are within the present disclosure.

As disclosed herein, practical processing approaches are described to etch copper metal traces along a surface with a sparse silver conductive layer in which the copper is effectively completely removed from exposed areas and the sparse silver conductive layer is substantially undamaged. The processing approaches can be suitable for incorporation into conventional processing lines, if desired, and the costs would be expected to fall within appropriate ranges. Thus, promising advances in device architecture based on silver nanowires can be adapted for use in devices with small bezels driving processing modifications.

EXAMPLES

The Examples test the effect of various solutions as etchants for metal traces used in patterned touch sensors—specifically copper traces. The etchants were tested for their ability to selectively etch copper and nickel films over touch sensors without impacting or destroying a silver nanowire based transparent conductive film beneath the traces.

The Examples make use of a transparent conductive film comprising a solvent with a stable dispersion of silver nanowires (AgNWs), a polymer binder, and a fusing solu-tion. The silver nanowire based film was essentially as described in Example 5 of U.S. Pat. No. 9,150,746 B1 to Li et al., entitled "Metal Nanowire Inks for the Formation of Transparent Conductive Films With Fused Networks," incorporated herein by reference. The silver nanowire based film with a fused metal nanostructured network was coated on a polyethylene terephthalate (PET) substrate. After coating, the film was heated in an oven at 120° C. for 2 min to dry the films.

An overcoat was applied directly over the silver nanowire based film to stabilize the conductive layer. The overcoat, comprised of crosslinked acrylate polymer, was essentially as described in U.S. Pat. No. 9,530,534 to Hu et al., entitled "Transparent conductive film," incorporated herein by reference. The transparent conductive film has a sheet resistance of $30 \pm 3$ ohms/sq prior to further processing. Metal layers of copper and nickel, suitable for forming metal traces, were then sputter deposited on the overcoat by a third party touch sensor supplier.

Example 1—Etching Using Iron Nitrate $(Fe(NO_3)_3$
$9H_2O)$, Nitric Acid $(HNO_3)$, and Surfactant This example tests the effect of iron nitrate $(Fe(NO_3)_3$ $9H_2O)$, nitric acid $(HNO_3)$, and an optional surfactant on the rate and uniformity of etching of nickel and copper films on samples.

One inch by one inch (1"×1") samples (substrate+silver nanowire film+overcoat+copper film+nickel film, as described above) were prepared. Each of the seven samples was immersed in 5 mL of the etching solution $(Fe(NO_3)_3$ $9H_2O+HNO_3+$optional surfactant, TRITON™ X-100) at room temperature (~22° C.) until the copper film was removed, in which the etching solution for each of the samples is specified in Table 1. Each of the samples was then rinsed in de-ionized water. The electrical resistance of the film can be expressed as a sheet resistance, which is reported in units of ohms per square $(\Omega/ø$ or ohms/sq) to distinguish the values from bulk electrical resistance values according to parameters related to the measurement process. Sheet resistance was measured with a contactless resistance meter after rinsing and allowing the samples to dry.

The etching times and measured sheet resistance for the etched samples are compared in Table 1. The etching of the metal was evaluated visually. The results of visual observation suggest that etching formulations with surfactant (formulations 1-6) provided better etching uniformity, whereas the etching formulation without surfactant etched the sample faster, but with less uniformity—comparing formulations 7 versus 5, as seen from Table 1.

TABLE 1

| | 1 | 2 | 3 | 4 | 5 | 6 | 7 |
|---|---|---|---|---|---|---|---|
| Fe(NO₃)₃ 9H₂O, M | 0.025 | 0.0124 | 0.025 | 0.0124 | 0.0062 | 0.0062 | 0.0062 |
| HNO₃, M | 0.0079 | 0.0079 | 0.0016 | 0.0016 | 0.0079 | 0.0016 | 0.0079 |
| TRITON ™ X-100, | 0.10 | 0.10 | 0.10 | 0.10 | 0.10 | 0.10 | — |
| Rs (Ω/□) | 62 | 38 | 47 | 38 | — | — | 34 |
| Ni etched, s | 23 | 30 | 26 | 45 | 50 | 80 | 40 |
| Cu cleared, s | 190 | 420 | 200 | 180 | >1800; All silver cleared <4 h, 40 m | >1800; All silver cleared <4 h, 40 m | 200; Not uniform etching |

Example 2—Etching Using Iron Nitrate (Fe(NO$_3$)$_3$ 9H$_2$O), Nitric Acid (HNO$_3$), and Surfactant This example also tests the effect of Iron(III), acidity, and a surfactant on the rate and uniformity of etching of nickel and copper films on samples.

Figure 8:
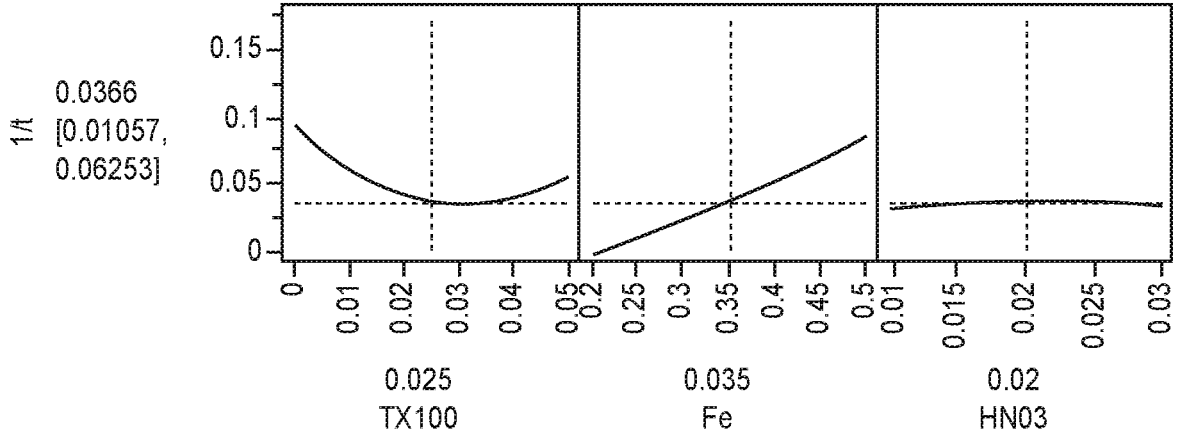
FIG. 8 is a plot of etch times as a function of concentrations for $Fe^{+3}$ cations, nitric acid and surfactant.

Another set of one inch by one inch (1"×1") samples (substrate+silver nanowire film+overcoat+copper film+nickel film) were prepared. Each of the samples was immersed in 5 mL of the etching solution (Fe(NO$_3$)$_3$ 9H$_2$O+HNO$_3$+optional surfactant, TRITON™ X-100) at room temperature (~22° C.) until the copper film was visibly gone. The etching solutions in this Example had lower concentrations of surfactant relative to the etching solutions of Example 1. Each of the 16 samples was then rinsed in de-ionized water. Sheet resistance was measured with a contactless resistance meter after rinsing and allowing the samples to dry.

frame of FIG. 8, the amount of surfactant was found to have a roughly quadratic effect on the etching rate.

Example 3—Etching Using Iron(III) Nitrate (Fe (NO$_3$)$_3$ 9H$_2$O) with Iron(II) Sulfate (FeSO$_4$ 7H$_2$O), Nitric Acid (HNO$_3$), and Surfactant This example also tests the effect of combined Iron(III)/Iron(II) in the presence of acid and a surfactant on the rate and uniformity of etching of nickel and copper films on samples.

The combined use of both Iron(III) and Iron(II) in the same etching solution offers the opportunity of varying and controlling the redox strength of the solution by adjusting the ratio [Fe$^{3+}$]/[Fe$^{2+}$], as expressed by the Nernst equation: $E_{red}=E_0-(RT/F)\ln([Fe^{2+}]/[Fe^{3+}])$.

One inch by one inch (1"×1") samples (substrate+silver nanowire based film+overcoat+copper film+nickel film)

TABLE 2

|  | 1 | 2 | 3 | 4 | 5 | 6 | 7 | 8 |
|---|---|---|---|---|---|---|---|---|
| Fe(NO$_3$)$_3$ 9H$_2$O, M | 0.00866 | 0.01238 | 0.01238 | 0.00495 | 0.00495 | 0.00495 | 0.01238 | 0.00619 |
| HNO$_3$, M | 0.00317 | 0.00476 | 0.00159 | 0.00317 | 0.00159 | 0.00476 | 0.00476 | 0.00476 |
| TRITON ™ X-100, % | 0.05 | 0.05 | 0.05 | 0.025 | 0 | 0 | 0 | 0.05 |
| Rs (Ω/□) | 35 | 42 | 31 | 22* | 54 | 54 | 50 | — |
| Ni etched, s | 60 | 40 | 50 | 135 | 60 | 60 | 40 | 65 |
| Cu cleared, s | 870 | 590 | 863 | 2300 | 1500 | 1860 | 465 | >5000 |

|  | 9 | 10 | 11 | 12 | 13 | 14 | 15 | 16 |
|---|---|---|---|---|---|---|---|---|
| Fe(NO$_3$)$_3$ 9H$_2$O, M | 0.00866 | 0.00866 | 0.00866 | 0.00495 | 0.01238 | 0.01238 | 0.00866 | 0.00866 |
| HNO$_3$, M | 0.00159 | 0.00476 | 0.00317 | 0.00159 | 0.00159 | 0.00317 | 0.00317 | 0.00317 |
| TRITON ™ X-100, % | 0.025 | 0.025 | 0 | 0.05 | 0 | 0.025 | 0.025 | 0.025 |
| Rs (Ω/□) | 32 | 32 | 50 | — | 45 | 52 | — | — |
| Ni etched, s | 70 | 60 | 40 | — | 40 | 45 | 90 | 90 |
| Cu cleared, s | 1530 | 1380 | 660 | >5580 | 410 | 840 | 3960 | 3960 |

*Some spotty metal residue remained on this sample.

The etching times and measured sheet resistance for the samples based on different etching solution formulations are compared in Table 2. The results suggest that higher concentration of Fe(NO$_3$)$_3$ 9H$_2$O was useful to etch the samples in a shorter period of time without impacting the silver nanowire film. These results demonstrate, referring to samples 1, 3, 9, and 10, that the copper can be etched off with little if any damage to the transparent conductive silver layer with sheet resistances measured at 31-35 ohms/sq.

Referring to FIG. 8, the results were evaluated in terms of the concentration effects on the etching rate, evaluated as being proportional to 1/t where t is the time for removal of were prepared. Each of the samples was immersed in 5 mL of the etching solution (Fe(NO$_3$)$_3$ 9H$_2$O+FeSO$_4$ 7H$_2$O+HNO$_3$+surfactant, TRITON™ X-100) at room temperature (~22° C.) until the copper film was visibly gone. Each of the samples was then rinsed in de-ionized water. Sheet resistance was measured with a contactless resistance meter after rinsing and allowing the samples to dry. Six samples with selected amounts of reactants were used, and the results from the use of these samples is presented in Table 3.

TABLE 3

|  | 1 | 2 | 3 | 4 | 5 | 6 |
|---|---|---|---|---|---|---|
| Fe(NO$_3$)$_3$, M | 0.0124 | 0.0124 | 0.0124 | 0.0248 | 0.0124 | 0.0124 |
| FeSO$_4$, M | 0.0180 | 0.0270 | 0.0090 | 0.0360 | 0.0180 | 0.0180 |
| HNO$_3$, M | 0.00317 | 0.00317 | 0.00317 | 0.00317 | 0.00317 | 0.00317 |
| TX-100 ™, % | 0.01% | 0.01% | 0.01% | 0.01% | 0.02% | 0.00% |
| [Fe$^{3+}$]/[Fe$^{2+}$]. | 0.688 | 0.459 | 1.376 | 0.688 | 0.688 | 0.688 |
| Ni etched, s | 55 | 70 | 50 | 50 | 60 | 65 |
| Cu cleared, s | 1320 | 1110 | 1115 | 540 | 1560 | 1530 |
| Rs (Ω/□) | 48 | 41 | 43 | 56 | 54 | 76 | the copper. The results suggest that the rate of etching was affected roughly linearly by the concentration of Fe(NO$_3$)$_3$ 9H$_2$O, but almost no effect was found for the concentration of HNO$_3$, which is consistent with the acid playing the role of a catalyst or stabilizer of the iron+3 As seen in the first The etching times and measured sheet resistance for the samples using different etching solution formulations are compared in Table 3. Etching was observed to occur faster around the edges of the sample, so there was more exposure and, therefore etching, of the silver nanowire based film at the edges. A slightly higher sheet resistance of these samples was also observed as compared to the best samples in Examples 1 and 2. Higher $[Fe^{3+}]/[Fe^{2+}]$ ratio and higher total $Fe^{3+}$ concentration generally led to faster etching, in approximate agreement with the expected strength of the etching formulation.

Example 4—Etching Using Iron Chloride Fe(Cl₃)₃, Nitric Acid (HNO₃), and Surfactant This example also tests the effect of Iron(III), acidity, and a surfactant on the rate and uniformity of etching of nickel and copper films on samples.

One inch by one inch (1"×1") samples (substrate+silver nanowire film+overcoat+copper film+nickel film) were prepared. Each of the samples was immersed in 5 mL of the etching solution FeCl₃+HNO₃+surfactant, TRITON™ X-100) at room temperature (~22° C.) until the copper film was visibly gone. Each of the samples was then rinsed in de-ionized water. Sheet resistance was measured with a 4-point probe method, a contactless resistance meter after rinsing and allowing the samples to dry.

TABLE 4

|  | 1 | 2 | 3 | 4 | 5 | 6 | 7 | 8 |
|---|---|---|---|---|---|---|---|---|
| FeCl₃ 6H₂O, M | 0.0370 | 0.0740 | 0.0185 | 0.0185 | 0.0370 | 0.0370 | 0.0740 | 0.0370 |
| HNO₃, M | 0.00317 | 0.00317 | 0 | 0.00317 | 0 | 0.00317 | 0 | 0 |
| TRITON ™ X-100, % | 0.01 | 0.03 | 0.03 | 0.03 | 0.03 | 0.01 | 0.01 | 0.01 |
| Ni etched, s | 45 | 12 | 38 | 30 | 16 | 15 | 12 | 20 |
| Cu cleared, s | 230 | 70 | 235 | 270 | 126 | 113 | 63 | 123 |
| 1/t, (min⁻¹) | 0.261 | 0.857 | 0.255 | 0.222 | 0.476 | 0.531 | 0.952 | 0.488 |
| Rs (Ω/□) | 71 | 75 | 131 | 71 | 71 | 73 | 65 | 68 |

The etching times and measured sheet resistance for the samples using different etching solution formulations are compared in Table 4. Etching was observed to occur faster around the edges of the sample, so there was more exposure and, therefore etching, of the silver nanowire film at the edges. A higher sheet resistance of these samples was also observed as compared to the best samples in Examples 1 and 2. However, as with Examples 1 and 2, the results suggest that the rate of etching was not strongly affected by the concentration of HNO₃. The amount of surfactant was found to have a roughly quadratic effect on the etching rate.

Comparative Example 1—Etching Using Chromic Acid

This example tests the effect of chromic acid on the rate and uniformity of etching of the nickel and copper films on samples.

One inch by one inch (1"×1") samples (substrate+silver nanowire film+overcoat+copper film+nickel film) were prepared. Each of the samples was immersed in 5 mL of the etching solution (chromic acid), as shown in Table 5, at room temperature (~22° C.) for five minutes.

TABLE 5

|  | 1 | 2 |
|---|---|---|
| Chromic acid | 1% (~0.08M) | 5% (~0.4M) |
| Time | 5 min | 5 min |
| Effect | None | None |

It was observed that, after five minutes, there was no effect on the copper or nickel films. The results suggest that chromic acid does not etch the films.

Comparative Example 2—Etching Using Chromic Acid, Sulfuric Acid, and Surfactant This example tests the effect of chromic acid, sulfuric acid, and a surfactant on the rate and uniformity of etching of the nickel and copper films on samples.

One inch by one inch (1"×1") samples (substrate+silver nanowire film+overcoat+copper film+nickel film) were prepared. Each of the nine samples was immersed in 5 mL of the etching solution (chromic acid+sulfuric acid+surfactant, TRITON™ X-100) with an etching solution composition as specified in Table 6 at room temperature (~22° C.) until the copper film was visibly gone. Each of the samples was then rinsed in de-ionized water. Sheet resistance was measured with a contactless resistance meter after rinsing and allowing the samples to dry.

TABLE 6

|  | 1 | 2 | 3 | 4 | 5 | 6 | 7 | 8 | 9 |
|---|---|---|---|---|---|---|---|---|---|
| Chromic acid, M | 0.042 | 0.064 | 0.042 | 0.064 | 0.064 | 0.021 | 0.021 | 0.021 | 0.042 |
| Sulfuric acid, M | 0.076 | 0.051 | 0.051 | 0.025 | 0.076 | 0.025 | 0.051 | 0.076 | 0.025 |
| TRITON ™ X-100, % | 0.10% | 0.10% | 0.10% | 0.10% | 0.10% | 0.10% | 0.10% | 0.10% | 0.10% |
| Cu starting to etch, s | 40 | 50 | 40 | 80 | 30 | 90 | 40 | 35 | 45 |
| Cu cleared, s | 45 | 60 | 50 | 140 | 38 | 115 | 50 | 48 | 50 |

The etching times for the samples are compared in Table 6 for the different etching solutions. It was observed that etching of the copper proceeded to completion very quickly after it started, and generally the higher the concentration of sulfuric acid the faster the etching rate. However, a much higher sheet resistance (100-300 ohms/sq) of these samples was observed, even though the silver in the film was still present after etching.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A method for patterning a structure comprising a metal layer interfaced with a transparent conductive film, the method comprising:

contacting the metal layer through a patterned mask with an etching solution comprising $Fe^{+3}$ ions and nitric acid, the metal layer comprising copper, nickel, aluminum or alloys thereof, the transparent conductive film comprising conductive elements comprising silver, thereby etching the metal layer to expose a portion of the transparent conductive film.

2. The method of claim 1 wherein the etching solution comprises water and from about 0.001M to about 0.25M $Fe^{+3}$.

3. The method of claim 2 wherein the nitric acid is at a concentration from about 0.0001M to about 0.1M.

4. The method of claim 2 wherein the etching solution further comprises from 0.001 to about 0.5 wt % non-ionic surfactant.

5. The method of claim 2 wherein the etching solution further comprises from 0.001M to about 0.25M $Fe^{+2}$.

6. The method of claim 1 wherein the etching solution comprises from about 0.005M to about 0.05M $Fe^{+3}$, from about 0.0025 wt % to about 0.1 wt % non-ionic surfactant, and nitric acid at a concentration from about 0.00025M to about 0.03M, wherein anions balancing iron cations are nitrate anions.

7. The method of claim 1 wherein the transparent conductive film comprises a fused silver nanostructured network with a polymer overcoat having an average thickness from about 25 nm to about 500 nm.

8. The method of claim 1 wherein the contacting comprises immersion of the structure in the etching solution for a selected period of time, and the method further comprising rinsing the structure following completion of the immersion.

9. The method of claim 1 wherein the contacting comprises depositing the etching solution over the patterned mask, and the method further comprising depositing a rinse solution over the patterned mask at the completion of the etching process.

10. The method of claim 1 wherein the patterned mask comprises photoresist having a pattern formed using photolithography.

11. The method of claim 1 further comprising patterning the transparent conductive film after etching the metal layer.

12. The method of claim 11 wherein the patterning of the conductive film is performed using transparent conductive transfer film technology.

13. The method of claim 1 wherein the metal layer comprises a layer of copper covered with a layer of nickel or aluminum.

14. The method of claim 1 wherein following patterning the structure comprises a polymer substrate, a transparent conductive film covering at least part of a surface of the polymer substrate and metal traces confined to at least a portion of a bezel region along a border of the surface, wherein elements of the transparent conductive film are in electrical contact with a portion of the metal traces to form a conduction pathway through the transparent conductive film, wherein the transparent conductive film has a sheet resistance of no more than 95 ohms/sq.

15. The method of claim 14 wherein the transparent conductive film is significantly excluded from the bezel region.

16. The method of claim 14 wherein the bezel region has a width of less than about 5 mm.

17. The method of claim 14 wherein the transparent conductive film has a transmittance of at least about 90% and a haze of no more than about 1%.

18. The method of claim 14 wherein a plurality of electrical contact points exist between the elements of the transparent conductive film and the metal traces.

19. The method of claim 14 wherein the structure further comprises a photosensitive resin layer between the transparent conductive film and the polymer substrate.

20. The method of claim 19, the method further comprising exposing the structure to patterned light to selectively etch the transparent conductive film.

* * * * *